United States Patent
Zhang et al.

(10) Patent No.: US 10,890,809 B2
(45) Date of Patent: Jan. 12, 2021

(54) DISPLAY SUBSTRATE AND DISPLAY DEVICE

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Le Zhang, Beijing (CN); Pengcheng Tian, Beijing (CN); Ze Liu, Beijing (CN); Hong Liu, Beijing (CN); Xin Li, Beijing (CN)

(73) Assignees: BEIJING BOE OPTOELECTRONICS TECHNOLOGY CO., LTD., Beijing (CN); ROE TECHNOLOGY GROUP CO. LTD, Beijing (CN)

( * ) Notice: Subject to any disclaimer, the term of this patent is extended or adjusted under 35 U.S.C. 154(b) by 0 days.

(21) Appl. No.: 16/095,169

(22) PCT Filed: Feb. 27, 2018

(86) PCT No.: PCT/CN2018/077394
§ 371 (c)(1),
(2) Date: Oct. 19, 2018

(87) PCT Pub. No.: WO2018/177058
PCT Pub. Date: Oct. 4, 2018

(65) Prior Publication Data
US 2019/0146256 A1 May 16, 2019

(30) Foreign Application Priority Data
Mar. 30, 2017 (CN) .......................... 2017 1 0201252

(51) Int. Cl.
*G02F 1/1362* (2006.01)
*G02F 1/1335* (2006.01)
(Continued)

(52) U.S. Cl.
CPC .... *G02F 1/13394* (2013.01); *G02F 1/133512* (2013.01); *G02F 1/136204* (2013.01);
(Continued)

(58) Field of Classification Search
None
See application file for complete search history.

(56) References Cited

U.S. PATENT DOCUMENTS 6,108,057 A 8/2000 Kusanagi
2009/0079917 A1 3/2009 Pan
(Continued)

FOREIGN PATENT DOCUMENTS

CN 101393343 A 3/2009
CN 203444214 U 2/2014
(Continued)

OTHER PUBLICATIONS

English language machine translation of Lee, KR20160032751, https://worldwide.espacenet.com (Year: 2016).*
(Continued)

*Primary Examiner* — Jessica M Merlin
*Assistant Examiner* — Mark D Teets
(74) *Attorney, Agent, or Firm* — Brooks Kushman P.C.

(57) ABSTRACT

A display substrate and a display device are provided. The display substrate includes a display region and a non-display region located at a periphery of the display region. The non-display region includes a plurality of conductive poles arranged on a base substrate, and the plurality of conductive
(Continued)

poles is grounded and is distributed at the periphery of the display region to transfer static electricity out.

17 Claims, 2 Drawing Sheets

(51) Int. Cl.
  *G02F 1/1339* (2006.01)
  *H01L 23/60* (2006.01)
  *H05F 3/02* (2006.01)

(52) U.S. Cl.
  CPC ........ *G02F 1/136209* (2013.01); *H01L 23/60* (2013.01); *G02F 2202/22* (2013.01); *H05F 3/02* (2013.01)

(56) References Cited

U.S. PATENT DOCUMENTS

| | | | | |
|---|---|---|---|---|
| 2010/0079694 | A1* | 4/2010 | Yoshida | G02F 1/134363 349/40 |
| 2015/0333020 | A1* | 11/2015 | Fang | H01L 23/5286 257/71 |
| 2016/0187718 | A1* | 6/2016 | Shin | G02F 1/133512 349/110 |
| 2017/0219872 | A1* | 8/2017 | Ibaraki | G02F 1/136286 |
| 2018/0040607 | A1 | 2/2018 | Xiong et al. | |
| 2018/0107052 | A1 | 4/2018 | Jiang et al. | |
| 2018/0107337 | A1 | 4/2018 | Sun et al. | |
| 2018/0299724 | A1 | 10/2018 | Gu et al. | |

FOREIGN PATENT DOCUMENTS

| | | | |
|---|---|---|---|
| CN | 105068306 | A | 11/2015 |
| CN | 105093629 | A | 11/2015 |
| CN | 105138188 | A | 12/2015 |
| CN | 105425457 | A | 3/2016 |
| CN | 105425458 | A | 3/2016 |
| CN | 105445998 | A | 3/2016 |
| CN | 105607332 | A | 5/2016 |
| CN | 106154632 | A | 11/2016 |
| CN | 106773430 | A | 5/2017 |
| CN | 206573816 | U | 10/2017 |
| KR | 20070025153 | A | 3/2007 |
| KR | 20160032751 | A * | 3/2016 |

OTHER PUBLICATIONS

First Office Action for Chinese Application No. 201710201252.4, dated Jan. 31, 2019, 9 Pages.

International Search Report and Written Opinion for Application No. PCT/CN2018/077394, dated Jun. 8, 2018, 11 Pages.

* cited by examiner

DISPLAY SUBSTRATE AND DISPLAY DEVICE

CROSS-REFERENCE TO RELATED APPLICATION APPLICATIONS

This application is the U.S. national phase of PCT Application No. PCT/CN2018/077394 filed on Feb. 27, 2018, which claims priority to Chinese Patent Application No. 201710201252.4 filed on Mar. 30, 2017, which are incorporated herein by reference in their entireties.

TECHNICAL FIELD

The present present disclosure relates to the field of display technology, in particular to a display substrate and a display device.

BACKGROUND

In the manufacturing process of a display panel, static electricity is inevitably introduced. The static electricity is one of the main factors affecting and causing a display device to be failed. The accumulation of the static electricity may cause a display screen to appear purple or green, degrading the display quality. Therefore, the shielding and protection of static electricity is one of factors to be considered in designing the display panel. Anti-static ability is one of the main performances and reliability evaluation indicators of the display panel.

SUMMARY

A display substrate and a display device are provided according to the present disclosure, so as to eliminate the adverse effect of static electricity on the display process.

In view of the above, a display substrate is provided according to an embodiment of the present disclosure, which includes a display region and a non-display region located at a periphery of the display region. The non-display region includes a plurality of conductive poles arranged on a base substrate, and the plurality of conductive poles is grounded and is distributed at the periphery of the display region to transfer static electricity out.

A display device is further provided according to an embodiment of the present disclosure, which includes the display substrate described above.

In the above technical solution, the plurality of conductive poles is arranged in the non-display region of the display substrate, and the plurality of conductive poles is grounded and distributed at the entire periphery of the display region to transfer static electricity out.

BRIEF DESCRIPTION OF THE DRAWINGS

In order to explain the technical solutions in embodiments of the present present disclosure or the prior art more clearly, accompanying drawings of the embodiments or the prior art are briefly illustrated hereinafter. Apparently, the accompanying drawings described hereinafter are only some embodiments of the present present disclosure, and those skilled in the art can further obtain other drawings according to the drawings without creative work.

DETAILED DESCRIPTION

Hereinafter, specific embodiments of the present disclosure are described in details in conjunction with the drawings and the embodiments. The following embodiments are used to explain the present present disclosure, but are not intended to limit the scope of the present disclosure.

Figure 1:
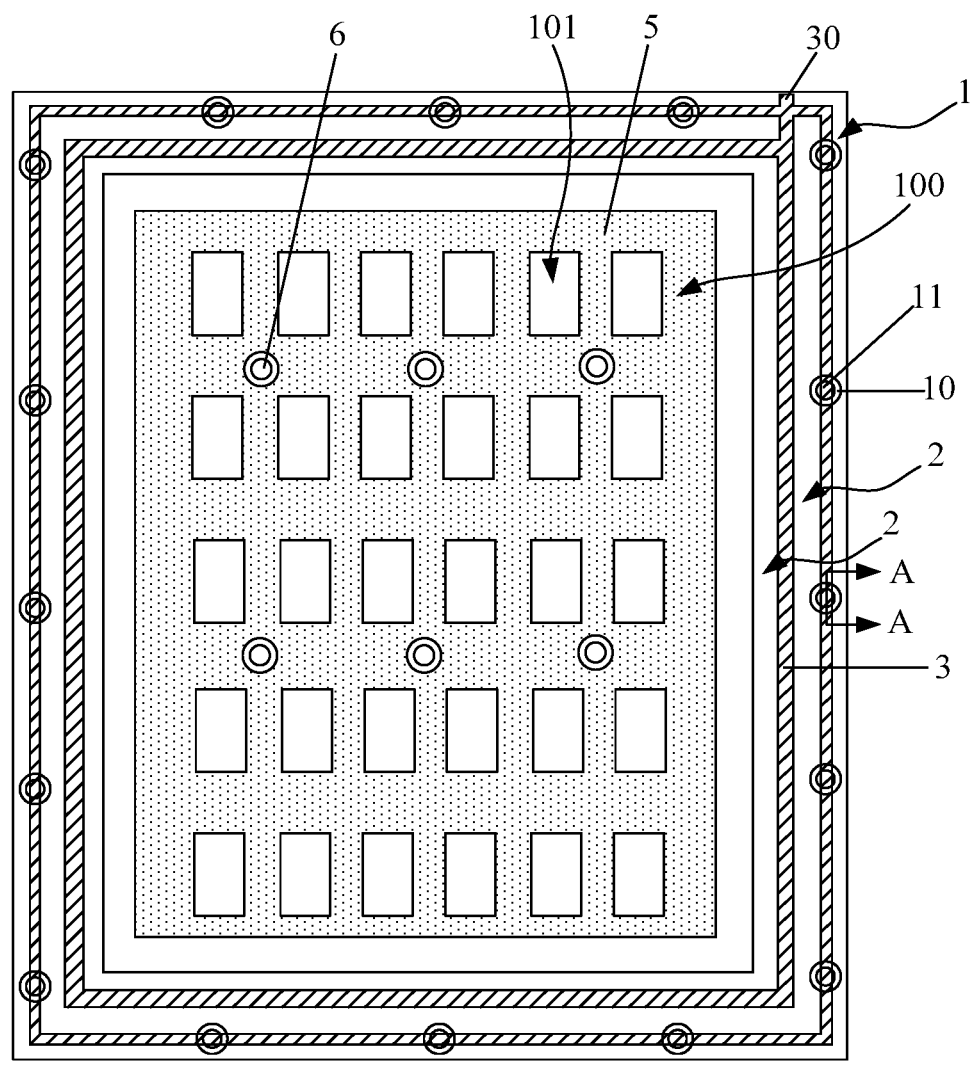
FIG. 1 is a schematic structural diagram of a color filter substrate according to some embodiments of the present present disclosure.

As shown in FIG. 1, a display substrate is provided according to an embodiment of the present disclosure, which includes a display region 100 and a non-display region located at a periphery of the display region 100. The non-display region includes a plurality of conductive poles 1 arranged on a base substrate 200, and the plurality of conductive poles 1 is grounded and is distributed over the entire periphery of the display region 100 to transfer static electricity out, thereby preventing the static electricity from adversely affecting the display process, and improving a display quality of a display product.

In some embodiments of the present disclosure, the plurality of conductive poles 1 may be evenly distributed at the entire periphery of the display region 100, so as to improve the effect of transferring the static electricity out. In a specific design, the plurality of conductive poles 1 may be unevenly distributed over the entire periphery of the display region 100. For example, a distribution density of conductive poles 1 is lager at the periphery of the display region 100 with more static electricity, and the distribution density of conductive poles 1 is smaller at the periphery of the display region 100 with less static electricity. The distribution density of conductive poles is not limited in the present disclosure.

In a specific implementation, each of the conductive poles 1 includes: an insulated pole body 10, and a second conductive layer 11 covering the pole body 10 to reduce the manufacturing cost. A distribution trajectory of all the pole bodies at the periphery of the display region is in an annular shape. Further, a plurality of the second conductive layers 11 may be arranged along the annular distribution trajectory of the pole bodies 10, and are interconnected to form an annular conductive structure, which increases an area of the conductive structure, thereby enabling the static electricity to be rapidly released.

The annular shape may include a circular ring, an elliptic ring, and a rectangle ring, and the rectangle ring may be a rectangle with rounded corners or a rectangle with sharp corners, which is not limited in the present disclosure.

Figure 2:
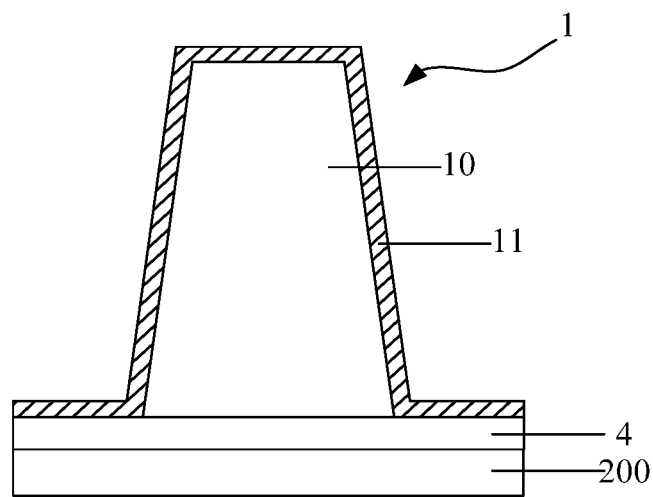
FIG. 2 is a partial cross-sectional view of FIG. 1 taken along line A-A.

As shown in FIG. 2, in order to better release static electricity, an area of a cross section of the conductive pole 1 parallel to a plane where a bottom surface of the conductive pole 1 is in contact with the base substrate 200 is arranged to decrease gradually in a direction away from the bottom surface, and it is conducive to release static electricity based on the principle of point discharge.

In an optional embodiment, the plurality of conductive poles 1 are evenly distributed over the entire periphery of the display region 100, and an area of a cross section of the conductive pole 1 parallel to a plane where a bottom surface in contact with the base substrate 200 is located is arranged to decrease gradually in a direction away from the bottom surface, thereby rapidly releasing static electricity, and improving the effect of transferring static electricity out.

The display substrate according to the embodiment is adapted to a liquid crystal display device, an organic electroluminescence display device or the like, so as to improve the anti-static ability of the display device, and overcome the adverse effect of the accumulation of static electricity on the display quality, thereby improving the display quality.

In order to avoid light leak in the non-display region, the non-display region of the display substrate is covered with a light-shielding structure 4, the light-shielding structure 4 is arranged around the display region. Further, the light-shielding structure 4 has at least one annular groove 2, the at least one groove 2 has an annular cross section on a plane where the substrate is located, and the at least one groove 2 is arranged around the periphery of the display region 100, so as to prevent static electricity from entering the display region 100 and prevent the accumulation of static electricity from influencing the display process of the display region 100.

In some embodiments of the present disclosure, the at least one groove 2 may be located on a side of the conductive pole 1 near to the display region 100, or may also be located on a side of the conductive pole 1 away from the display region 100.

In some embodiments of the present disclosure, the light-shielding structure 4 has at least two annular grooves 2 to improve the effect of preventing static electricity.

Further, a surface of a portion of the light-shielding structure 4 between the adjacent two grooves 2 may be covered with a first conductive layer 3, and the first conductive layer 3 is grounded for transferring static electricity out to improve the display quality of a display product.

In an optional embodiment, at least two annular grooves 2 are arranged at a side of the conductive pole 1 near to the display region 100, and a surface of a portion of the light-shielding structure 4 between the adjacent two grooves 2 is covered with a first conductive layer 3. In the above technical solution, the conductive pole 1 and the first conductive layer 3 as two conductive structures are used for transferring static electricity out, and the anti-static ability of the display product is improved in two aspects of transferring static electricity out and preventing static electricity from entering into the display region 100, thereby avoiding the problem that the accumulation of static electricity adversely affects the display quality.

The technical solution of the present disclosure is specifically introduced by taking the display substrate being a color filter substrate of a liquid crystal display device as an example below.

In a case that the display substrate is a color filter substrate, the display region 100 includes a black matrix 5 arranged on the base substrate 200 for defining a plurality of pixel regions 101. In a case that the color filter substrate further includes a spacer 6, the conductive pole 1 may be configured to include a pole body 10 and a second conductive layer 11 covering the pole body 10, and the pole body 10 is arranged in the same layer as the spacer 6. The pole body 10 and the spacer 6 are obtained by performing a single patterning process on a same material film layer to simplify the process and reduce the manufacturing cost.

In some embodiments of the present disclosure, the plurality of conductive poles 1 may be evenly distributed at the entire periphery of the display region 100, so as to improve the effect of transferring static electricity out. A distribution trajectory of the pole bodies 10 at the periphery of the display region is in an annular shape, and a plurality of the second conductive layers 11 arranged along the annular distribution trajectory of the pole bodies 10 is interconnected to form an annular conductive structure, increasing the area of the conductive structure to rapidly release static electricity. The non-display region may be further provided with a connection structure 30 for connecting the second conductive layer 11 and a silver glue dot (not shown in drawings) to transfer static electricity out through the silver glue dot. The connection structure 30 and the second conductive layer 11 may be configured in a unitary structure.

Further, in a case that the color filter substrate includes a common electrode (not shown in drawings), and the second conductive layer 11 may be arranged in the same layer as the common electrode layer to simplify the process.

In some embodiments of the present disclosure, the light-shielding structure 4 and the black matrix 5 of the non-display region may be arranged in the same layer, which are obtained by performing a single patterning process on a same light-shielding film to simplify the process. The light-shielding structure 4 is arranged around the display region, the light-shielding structure 4 is provided with at least one annular groove 2, the at least one groove 2 has an annular cross section on a plane where the substrate is located, and the at least one groove 2 is arranged around the periphery of the display region 100. In this way, static electricity can be prevented from entering into the display region 100, and the accumulation of static electricity is prevented from adversely affecting the display process of the display region 100.

In some embodiments of the present disclosure, the light-shielding structure 4 has at least two annular grooves 2 to improve the effect of preventing static electricity.

Further, a surface of a portion of the light-shielding structure 4 between the adjacent two grooves 2 may be covered with a first conductive layer 3, and the first conductive layer 3 is grounded for transferring static electricity out. In a case that the color filter substrate includes common electrodes, the first conductive layer 3 may be arranged in the same layer as the common electrode layer to simplify the process.

It should be noted that the above embodiment only introduces the specific implementation of the anti-static structure (including the conductive poles, the grooves and the first conductive layer according to the embodiment) of the present disclosure by taking the display substrate being a color filter substrate as an example. For other types of display substrates, the anti-static structure of the present disclosure may be designed according to the specific structures of the display substrates, which are not described in detail herein, and all of which fall within the protective scope of the present disclosure.

A display device is further provided according to an embodiment of the present disclosure, which includes the display substrate described above, so as to improve the anti-static ability of the display device, and overcome the adverse effect of the accumulation of static electricity on the display quality, thereby improving the display quality.

The display device may be a liquid crystal display device, an organic electroluminescence display device or the like.

In a case that the display device is a liquid crystal display device, the display device includes a color filter substrate and an array substrate oppositely arranged to form a cell, and sealant is covered on the seal region of the non-display region to achieve the sealed cell.

The display substrate may be a color filter substrate or an array substrate.

Figure 3:
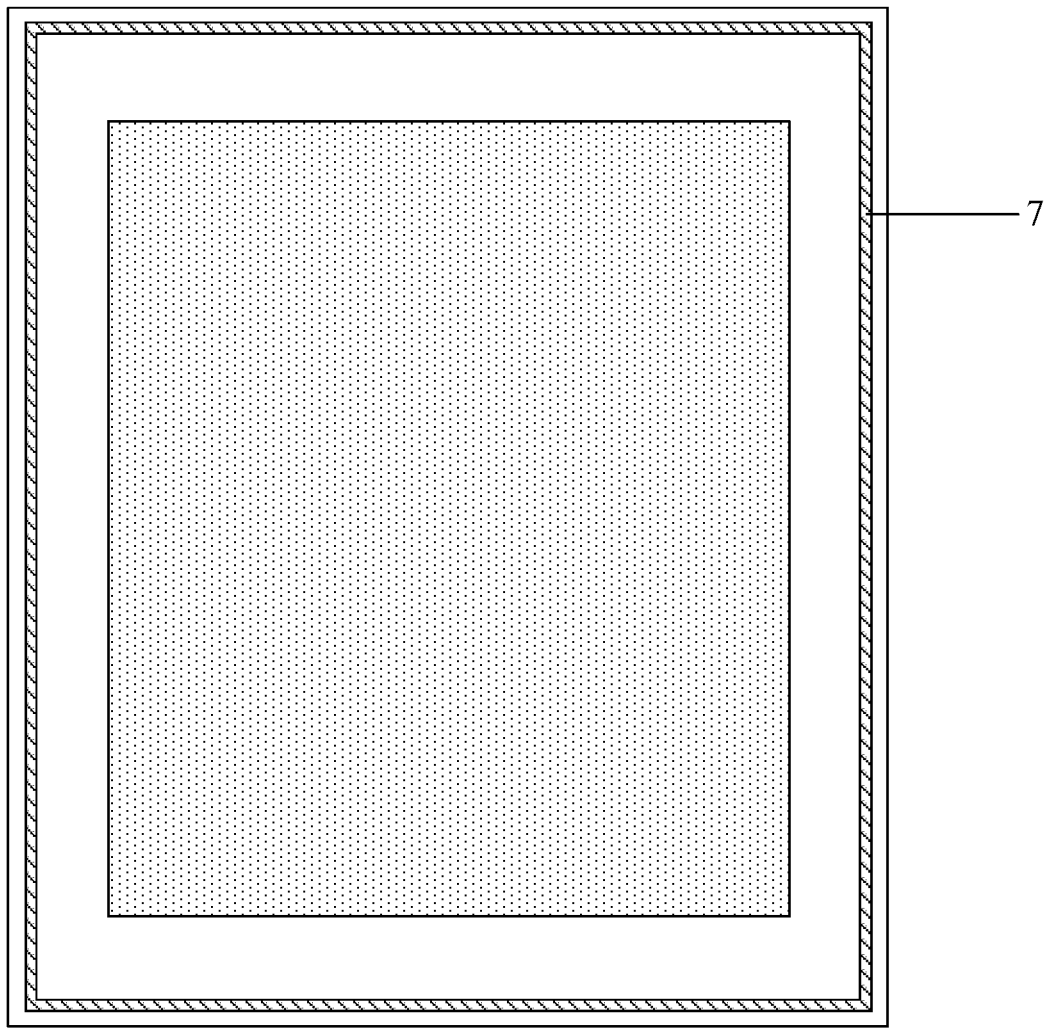
FIG. 3 is a schematic structural diagram of an array substrate according to some embodiments of the present present disclosure.

As shown in FIG. 3, in a case that the display substrate is a color filter substrate, the array substrate is provided with a grounded conductive line 7, and the plurality of conductive poles 1 is in electrical contact with the conductive line 7 to rapidly transfer static electricity out. Specifically, the grounded conductive line is arranged on a side of the conductive pole of which the annular track is away from the display region.

Specifically, the conductive poles 1 may be located on a side of sealant away from the display region 100, and thus the conductive poles 1 may play a role of blocking the sealant from overflowing.

The forgoing descriptions are only optional embodiments of the present present disclosure. It should be noted that numerous improvements and substitutions made to the present present disclosure can further be made by those skilled in the art without being departing from the technical principle of the present disclosure, and those improvements and substitutions shall fall into the scope of protection of the present disclosure.

What is claimed is:

1. A display substrate, comprising:
a display region and a non-display region located at a periphery of the display region, wherein the non-display region comprises a plurality of conductive poles arranged on a base substrate, and the plurality of conductive poles is grounded and is distributed at the periphery of the display region to transfer static electricity out,
wherein the display region comprises a black matrix arranged on the base substrate and configured to define a plurality of pixel regions,
wherein the non-display region further comprises a light-shielding structure arranged in a same layer as the black matrix, the light-shielding structure is arranged around the display region, the light-shielding structure is provided with at least two annular grooves, each of the at least two grooves is arranged around the periphery of the display region, a first conductive layer covers a surface of a portion of the light-shielding structure between the adjacent two grooves of the at least two annular grooves, and the first conductive layer is grounded for transferring the static electricity out,
wherein in a direction from the non-display region to the display region, one of the plurality of conductive poles, a first groove of the at least two grooves, the first conductive layer, a second groove of the at least two grooves are arranged in sequence; and
orthographic projections of the plurality of conductive poles onto the base substrate, an orthographic projection of the first groove onto the base substrate, an orthographic projection of the first conductive layer onto the base substrate, and an orthographic projection of the second groove onto the base substrate do not overlap with each other.

2. The display substrate according to claim 1, wherein each of the at least two grooves is located on a side of the conductive poles close to the display region.

3. The display substrate according to claim 1, wherein an area of a cross section of each of the conductive poles parallel to a plane where a bottom surface of the conductive pole is in contact with the base substrate decreases gradually in a direction away from the bottom surface.

4. The display substrate according to claim 1, wherein each of the plurality of conductive poles comprises: a pole body, and a second conductive layer covering the pole body.

5. The display substrate according to claim 4, wherein the display region further comprises a spacer arranged on the black matrix, and the spacer is arranged in a same layer as the pole body.

6. The display substrate according to claim 4, wherein a distribution trajectory of the pole body at the periphery of the display region is annular, and the plurality of second conductive layers arranged along the annular distribution trajectory of the pole body is interconnected to form an annular conductive structure.

7. The display substrate according to claim 4, wherein the pole body and the spacer are obtained by performing a single patterning process on a same material film layer.

8. The display substrate according to claim 1, wherein the plurality of conductive poles is evenly distributed at the entire periphery of the display region.

9. The display substrate according to claim 1, wherein the display region is a rectangle, and at least three conductive poles are arranged uniformly at the periphery of each of four sides of the display region.

10. A display device, comprising a display substrate,
wherein the display substrate comprises a display region and a non-display region located at a periphery of the display region, the non-display region comprises a plurality of conductive poles arranged on a base substrate, and the plurality of conductive poles is grounded and is distributed at the periphery of the display region to transfer static electricity out,
wherein the display region comprises a black matrix arranged on the base substrate and configured to define a plurality of pixel regions,
wherein the non-display region further comprises a light-shielding structure arranged in a same layer as the black matrix, the light-shielding structure is arranged around the display region, the light-shielding structure is provided with at least two annular grooves, each of the at least two grooves is arranged around the periphery of the display region, a first conductive layer covers a surface of a portion of the light-shielding structure between the adjacent two grooves of the at least two annular grooves, and the first conductive layer is grounded for transferring the static electricity out,
wherein in a direction from the non-display region to the display region, one of the plurality of conductive poles, a first groove of the at least two grooves, the first conductive layer, a second groove of the at least two grooves are arranged in sequence; and
orthographic projections of the plurality of conductive poles onto the base substrate, an orthographic projection of the first groove onto the base substrate, an orthographic projection of the first conductive layer onto the base substrate, and an orthographic projection of the second groove onto the base substrate do not overlap with each other.

11. The display device according to claim 10, wherein the display substrate is a color filter substrate, the display device further comprises an array substrate, and the color filter substrate and the array substrate are oppositely arranged to form a cell; and
wherein the array substrate is provided with a grounded conductive line, and the plurality of conductive poles is in electrical contact with the conductive line.

12. The display device according to claim 11, wherein the grounded conductive line is arranged on a side of the conductive poles whose annular distribution trajectory is away from the display region.

13. The display device according to claim 11, wherein the non-display region is further provided with a connection structure for connecting a second conductive layer and a silver glue dot to transfer static electricity out through the silver glue dot.

14. The display device according to claim 13, wherein the connection structure and the second conductive layer are configured in a unitary structure.

15. The display device according to claim 10, wherein the conductive poles are located on a side of a sealant away from the display region to block the sealant from overflowing.

16. The display device according to claim 10, wherein each of the plurality of conductive poles comprises: a pole body, and a second conductive layer covering the pole body.

17. The display device according to claim 16, wherein the display substrate comprises a common electrode, and the common electrode is arranged in a same layer as the second conductive layer.

* * * * *

UNITED STATES PATENT AND TRADEMARK OFFICE
CERTIFICATE OF CORRECTION

| | |
|---|---|
| PATENT NO. | : 10,890,809 B2 |
| APPLICATION NO. | : 16/095169 |
| DATED | : January 12, 2021 |
| INVENTOR(S) | : Le Zhang et al. |

Page 1 of 1

It is certified that error appears in the above-identified patent and that said Letters Patent is hereby corrected as shown below:

On the Title Page

Delete:
"(73) Assignees: BEIJING BOE OPTOELECTRONICS TECHNOLOGY CO., LTD., Beijing (CN); ROE TECHNOLOGY GROUP CO., LTD, Beijing (CN)"

And Insert:
--(73) Assignees: BEIJING BOE OPTOELECTRONICS TECHNOLOGY CO., LTD., Beijing (CN); BOE TECHNOLOGY GROUP CO., LTD., Beijing (CN)--.

Signed and Sealed this
Twenty-fifth Day of May, 2021

Drew Hirshfeld
*Performing the Functions and Duties of the*
*Under Secretary of Commerce for Intellectual Property and*
*Director of the United States Patent and Trademark Office*